US008350661B2

(12) United States Patent
Czubatyj et al.

(10) Patent No.: US 8,350,661 B2
(45) Date of Patent: Jan. 8, 2013

(54) BREAKDOWN LAYER VIA LATERAL DIFFUSION

(75) Inventors: Wolodymyr Czubatyj, Warren, MI (US); Tyler Lowrey, Rochester Hills, MI (US); Edward J. Spall, Manassas, VA (US)

(73) Assignee: Ovonyx, Inc., Sterling Heights, MI (US)

( * ) Notice: Subject to any disclaimer, the term of this patent is extended or adjusted under 35 U.S.C. 154(b) by 612 days.

(21) Appl. No.: 12/471,937

(22) Filed: May 26, 2009

(65) Prior Publication Data

US 2010/0301988 A1  Dec. 2, 2010

(51) Int. Cl.
*H01C 7/13* (2006.01)
(52) U.S. Cl. .................................................... 338/22 R
(58) Field of Classification Search .................. 338/22 R
See application file for complete search history.

(56) References Cited

U.S. PATENT DOCUMENTS

| 6,093,589 | A  | * | 7/2000  | Lo et al. ........................ 438/197 |
| 6,331,049 | B1 | * | 12/2001 | Leban ............................. 347/64 |
| 6,992,369 | B2 | * | 1/2006  | Kostylev et al. ............. 257/537 |
| 7,582,546 | B2 | * | 9/2009  | Kakoschke et al. .......... 438/526 |
| 2006/0118911 | A1 | * | 6/2006 | Kostylev et al. ............. 257/537 |
| 2008/0246016 | A1 | * | 10/2008 | Kakoschke et al. ............... 257/5 |
| 2010/0182827 | A1 | * | 7/2010  | Kostylev et al. .............. 365/163 |
| 2010/0301988 | A1 | * | 12/2010 | Czubatyj et al. ................ 338/13 |

* cited by examiner

*Primary Examiner* — James Harvey
(74) *Attorney, Agent, or Firm* — Kevin L. Bray

(57) ABSTRACT

An electronic device including a breakdown layer having variable thickness. The device includes a variable resistance material positioned between two electrodes. A breakdown layer is interposed between the variable resistance material and one of the electrodes. The breakdown layer has a non-uniform thickness, which serves to bias the breakdown event toward the thinner portions of the breakdown layer. As a result, the placement, size, and number of ruptures in the breakdown layer are more consistent over a series or array of devices. The variable resistance material may be a phase-change material. The variable-thickness breakdown layer may be formed through a diffusion process by introducing a gas containing a resistivity-enhancing species to the environment of segmented variable resistance devices during fabrication. The resistivity-enhancing element penetrates the outer perimeter of the variable resistance material and diffuses toward the interior of the device. The resistivity-enhancing species increases the resistance of the interface between the variable resistance material and the electrode by interacting with the variable resistance material and/or electrode to form a resistive interfacial material. Based on the diffusional nature of the process, the concentration of the resistivity-enhancing species decreases toward the center of the device and as a result, the breakdown layer is thinner toward the center of the device.

54 Claims, 9 Drawing Sheets

BREAKDOWN LAYER VIA LATERAL DIFFUSION

FIELD OF INVENTION

This invention relates to variable resistance memory devices. More particularly, this invention relates to a device structure and methods of making variable resistance memory devices having reduced programming currents. Most particularly, this invention relates to a variable resistance memory device structure that includes a breakdown layer formed through a lateral diffusion process.

BACKGROUND OF THE INVENTION

Variable resistance materials are promising active materials for next-generation electronic storage and computing devices. A variable resistance material possesses two or more states that differ in electrical resistance and can be programmed back and forth between the states by providing energy to induce an internal chemical, electronic, or physical transformation of the material that manifests itself as a change in resistance of the material. The different resistance states can be associated with different data values and used as memory states to store or process data.

Phase change materials are a promising class of variable resistance materials. A phase change material is a material that is capable of undergoing a transformation, preferably reversible, between two or more distinct structural states. The distinct structural states may be distinguished on the basis of, for example, crystal structure, atomic arrangement, order or disorder, fractional crystallinity, relative proportions of two or more different structural states, or a physical (e.g. electrical, optical, magnetic, mechanical) or chemical property. In a common embodiment, the two or more distinct structural states include differing proportions of crystalline phase regions and amorphous phase regions of the phase change material, where the phase-change material is reversibly transformable between the different states. In the crystalline state, the phase change material has lower resistivity; while in the amorphous state, it has higher resistivity. Continuous variations in resistivity over a wide range can be achieved through control of the relative proportions of crystalline phase regions and amorphous phase regions in a volume of phase-change material. Reversibility of the transformations between structural states permits reuse of the material over multiple cycles of operation.

Typically, a variable resistance device is fabricated by placing the active variable resistance material, such as a phase change material, between two electrodes. Operation of the device is effected by providing an electrical signal between the two electrodes and across the active material. In a common application, phase-change materials may be used as the active material of a memory device, where distinct data values are associated with the different structural states and each data value corresponds to a distinct resistance of the phase-change material. The different structural states employed in memory operation may also be referred to herein as memory states or resistance states of the phase-change material. Write operations in a phase-change memory device, which may also be referred to herein as programming operations, apply electric pulses to the phase-change material to alter its structural state to a state having the resistance associated with the intended data value. Read operations are performed by providing current or voltage signals across the two electrodes to measure the resistance. The energy of the read signal is sufficiently low to prevent disturbance of the structural state of the phase-change material.

In order to expand the commercial opportunities for phase-change memory, it is desirable to identify new phase-change compositions, device structures, and methods of programming that lead to improved performance. A key performance metric for phase-change memory is programming current. In order to reduce power consumption in commercial devices, it is desirable to minimize the current needed to program the device. The structural transformations that occur between amorphous, crystalline, and mixed amorphous-crystalline states require the input of energy. Most commonly, the energy is thermal in nature and produced by the Joule heating that accompanies the flow of electric current through the active phase-change material or surrounding resistive layers in electrical and thermal communication with the active phase-change material. Programming a phase-change memory device necessitates the production of a sufficient amount of Joule heating to increase the temperature of the phase-change material to above a threshold temperature (either the crystallization temperature or melting temperature, see below).

To minimize power consumption, it is necessary to design the phase-change device to insure that a given programming current maximizes the amount of thermal energy available for programming. Several strategies have been proposed for improving the power efficiency of phase-change devices. One strategy is to construct a device structure in which the phase-change material is surrounded by highly thermally insulative materials. The rationale of this strategy is to retain as much of the Joule heat that develops during programming as possible in close proximity to the phase-change material. Surrounding insulators prevent thermal dissipation of Joule heat to the adjacent device structure and improve utilization of the heat for programming purposes by localizing it in the vicinity of the phase-change material for a period of time sufficient to complete programming.

A second strategy is to place a resistive heater in close proximity to the phase-change material. This strategy recognizes that Joule heating scales with the power dissipated by the programming current, where power dissipation increases for a given current as the resistivity of a material increases. By placing a series resistive heater adjacent to a phase-change material, significant heating in the local vicinity of the phase-change material can occur at reduced programming currents.

A third strategy is to minimize the volume of phase-change material that undergoes a structural transformation during programming. The volume of phase-change material that undergoes a structural transformation may be referred to herein as the programmed volume of the phase-change material. This strategy recognizes, from a thermodynamic standpoint, that the heat needed to effect a structural transformation scales with the volume of material undergoing the transformation. By reducing the programmed volume of a phase-change material, a reduction in programming current results.

One approach for minimizing the programmed volume is to modify the device structure to reduce the area of contact between the phase-change material and the electrode that delivers the programming current. The use of conductive sidewall layers as electrodes, for example, permits electrical communication with the phase-change material to occur through the edge of a conductive layer. Since the edge thickness corresponds to the thickness of the layer and since layer thickness can be controlled at angstrom-scale dimensions, small contact areas (including areas having sublithographic dimensions) can be achieved. As an alternative, small dimensions can be achieved by patterning of a conductive layer.

A second approach for minimizing the programmed volume is to adopt a confined cell device geometry. In the confined cell geometry, a narrow (preferably sublithographic) opening is formed in a surrounding (e.g. dielectric) layer and the phase-change material is formed in the opening using a conformal technique such as chemical vapor deposition or atomic layer deposition. The narrow physical dimensions of the phase-change material necessarily lead to a reduction in programming volume.

A third approach for minimizing the programmed volume is to incorporate a breakdown layer into the structure. The breakdown layer is one of the simpler approaches for reducing the programmed volume. A breakdown layer is a highly resistive or insulating layer formed between the phase-change material and the electrode of the device that delivers the programming current (referred to hereinafter as the programming electrode). When initially formed, the breakdown layer is intact and creates a resistive or insulating barrier between the programming electrode and phase-change material. The thickness of the breakdown layer, however, is kept sufficiently small to permit rupturing of the breakdown layer upon application of a critical voltage between the programming electrode and counterelectrode of the device. At the point of rupture, the breakdown layer is punctured and a conductive pathway from the programming electrode to the phase-change material develops. The advantage of the breakdown layer is that the lateral dimension of the puncture is typically much smaller than the lateral dimension of the adjacent phase-change material. The net result is a device structure in which the most of the phase-change material is shielded from the programming electrode by the resistive or insulative non-punctured portion of the breakdown layer and only a small area region of the phase-change material is in a low resistance path of current flow delivered by the programming electrode. The punctured region represents a high conductivity region through which current provided by the programming electrode preferentially flows. The net effect is a constriction of current flow to the punctured region and a reduction in the portion of the phase-change material influenced by the current.

From a processing standpoint, the breakdown layer approach for reducing programming current is the simplest to implement. The fabrication of breakdown devices only requires the inclusion of a single thin layer deposition step in the process flow. Many dielectrics known to be compatible with phase-change compositions function as breakdown layers, so inclusion of a breakdown layer adds no significant processing uncertainties. The cost, in terms of time and materials, needed to incorporate a breakdown layer is also minimal.

A drawback that has been identified for breakdown layers is inconsistency in the location of the punctured region. Small changes or differences in processing conditions (e.g. temperature, sputtering intensity, impurities), device structure (e.g. localized thickness or composition of constituent layers, electrode composition, device geometry, particulate contamination), or operating conditions (e.g. width or amplitude of programming pulse) can influence placement of the punctured region. In one device, the puncture may be located near the center of the breakdown layer, while in another device, the puncture may be located near the edge of the breakdown layer. The size of the puncture may also vary and the possibility of multiple punctures also exists. Differences in the location, size or number of punctures may lead to variability in programming current, endurance and other operating characteristics of the device. Variability in performance from device-to-device is especially problematic in memory device arrays. In order to standardize programming and reading protocols, it is desirable to have consistent performance for all devices in the array.

SUMMARY OF THE INVENTION

This invention provides device structures and methods of making variable resistance memory device structures that enable low current operation. The device structures include a breakdown layer that varies in composition or thickness across a lateral dimension. In the device structures, a variable resistance memory material is interposed between an upper electrode and a lower electrode. A breakdown layer is formed between the variable resistance memory material and one or both electrodes. The composition or thickness of the breakdown layer varies in a direction lateral to or transverse to the direction of current flow between the lower electrode and upper electrode.

The device structure may be fabricated by forming a conductive layer to serve as a lower electrode. A variable resistance material may next be formed over the lower electrode layer and a conductive upper electrode layer may then be formed over the variable resistance material. A non-uniform breakdown layer may be formed by introducing a gas into the deposition environment and allowing it to diffuse into the variable resistance material or an electrode material. The gas includes a resistivity-enhancing element, such as oxygen or nitrogen, which diffuses laterally into the variable resistance or electrode material from an edge or side. Due to the nature of the diffusion process, the concentration of the resistivity-enhancing element is highest at the lateral edges of the variable resistance or electrode material and progressively decreases toward the interior of the variable resistance or electrode material. The resistivity-enhancing element may be incorporated in the variable resistance material, electrode material or both.

The presence of the resistivity-enhancing element produces a resistive interface between the variable resistance material and the electrode. Because of the non-uniform concentration profile of the resistivity-enhancing element in the lateral direction, the breakdown resistance of the interface is non-uniform. Specifically, the interfacial breakdown resistance is higher near the lateral edges of the variable resistance material or electrode and decreases toward the interior. This variability in interface breakdown resistance has the effect of biasing the occurrence of the breakdown event toward the interior portion of the interface region. Breakdown is more readily initiated in the lower breakdown resistance interior portions of the interface region than in the higher breakdown resistance lateral portions of the interface region. In effect, the most likely area for electrical breakdown is significantly reduced and is concentrated in a small central region of the device. As a result, the area of the device that is susceptible to localized variations or defects in breakdown layer characteristics is reduced. In addition, this smaller area of most likely breakdown is shifted away from the device edges thereby reducing variations in performance caused by any potential edge effects. The net result is a more consistent breakdown event and greater uniformity in device characteristics.

In one embodiment, the variable resistance material is a phase-change material having a plurality of resistance states distinguished on the basis of structure. The resistance states may include a crystalline state, an amorphous state, and a series of mixed crystalline-amorphous states where the resistivity correlates with the relative proportion of crystalline and amorphous phase content and where the material can be reversibly transformed among the different structural states through electrical programming.

DETAILED DESCRIPTION OF THE ILLUSTRATED EMBODIMENTS

Figure 1:
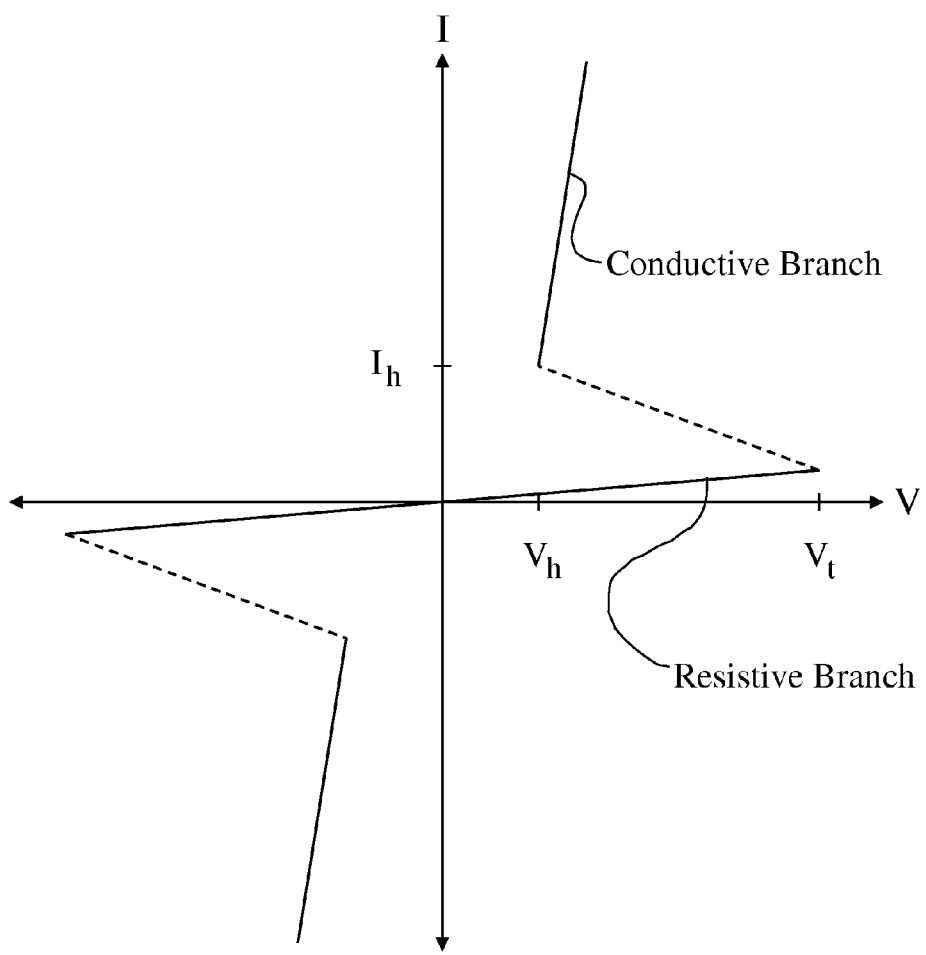
FIG. 1 is a depiction of the I-V characteristics of a chalcogenide material that exhibits an electrical switching transformation from a resistive state to a conductive state.

Although this invention will be described in terms of certain preferred embodiments, other embodiments that are apparent to those of ordinary skill in the art, including embodiments that do not provide all of the benefits and features set forth herein, are also within the scope of this invention. Accordingly, the scope of the invention is defined only by reference to the appended claims.

This invention provides variable resistance memory devices designed to operate with reduced programming currents. The programming current provides the energy needed to induce changes between the resistance states of the active variable resistance memory material of the device. In order to reduce power consumption, it is desirable to minimize the programming current. In this invention, reduction in programming current is achieved by using a breakdown layer to reduce the area of contact between the electrode delivering the programming current and the active variable resistance material. As the area of contact is reduced, the programmed volume of the variable resistance material can be reduced and less programming energy is required. The discussion that follows emphasizes phase-change materials as illustrative variable resistance materials. The general principles set forth herein, however, apply to variable resistance materials generally that operate at least in part through the action of an electrical current and that are transformable between two or more states distinguishable on the basis of resistance.

In order to appreciate the benefits of the instant invention, it is helpful to review the basic operational characteristics of phase-change memory devices. The following discussion focuses on chalcogenide materials as illustrative phase-change materials. The basic principles apply equally to other forms of phase-change or state-change materials, such as pnictides or other classes of materials transformable between two or more states distinguishable on the basis of structure, a physical property or a chemical property.

An important feature of the operation of chalcogenide-based phase-change memory devices and arrays is the ability of the chalcogenide memory material to undergo a phase transformation between or among two or more structural states. The chalcogenide memory materials have structural states that include a crystalline state, one or more partially-crystalline states and an amorphous state. The crystalline state may be a single crystalline state or a polycrystalline state. The amorphous state may be a glassy state, vitreous state, or other state lacking long range structural order. A partially-crystalline state refers to a structural state in which a volume of chalcogenide or phase-change material includes an amorphous portion and a crystalline portion. Generally, a plurality of partially-crystalline states exists for the chalcogenide or phase-change material, where different partially-crystalline states may be distinguished on the basis of the relative proportion of amorphous and crystalline regions. Fractional crystallinity is one way to characterize the structural states of a chalcogenide phase-change material. The fractional crystallinity of the crystalline state is 100%, the fractional crystallinity of the amorphous state is 0%, and the fractional crystallinities of the partially-crystalline states may vary continuously between 0% (the amorphous limit) and 100% (the crystalline limit). Phase-change chalcogenide materials are thus generally able to transform among a plurality of structural states that may vary inclusively between fractional crystallinities of 0% and 100%.

Transformations among the structural states are induced by providing energy to the chalcogenide memory material. Energy in various forms can induce structural transformations of the crystalline and amorphous portions to alter the fractional crystallinity of a chalcogenide memory material. Suitable forms of energy include one or more of electrical energy, thermal energy, optical energy or other forms of energy (e.g. particle-beam energy) that induce electrical, thermal or optical effects in a chalcogenide memory material. Continuous and reversible variability of the fractional crystallinity is achievable by controlling the energy environment of a chalcogenide memory material. A crystalline state can be transformed to a partially-crystalline or an amorphous state, a partially-crystalline state can be transformed to a crystalline, amorphous or different partially-crystalline state, and an amorphous state can be transformed to a partially-crystalline or crystalline state through proper control of the energy environment of a chalcogenide memory material. Some considerations associated with the use of thermal, electrical and optical energy to induce structural transformations are presented in the following discussion.

The use of thermal energy to induce structural transformations exploits the thermodynamics and kinetics associated with the crystalline to amorphous or amorphous to crystalline phase transitions. An amorphous phase may be formed, for example, from a partially-crystalline or crystalline state by heating a chalcogenide material above its melting temperature and cooling at a rate sufficient to inhibit the formation of crystalline phases. A crystalline phase may be formed from an amorphous or partially-crystalline state, for example, by heating a chalcogenide material above the crystallization temperature for a sufficient period of time to effect nucleation and/or growth of crystalline domains. The crystallization temperature is below the melting temperature and corresponds to the minimum temperature at which crystallization may occur. The driving force for crystallization is typically thermodynamic in that the free energy of a crystalline or partially-crystalline state in many chalcogenide memory materials is lower than the free energy of an amorphous state so that the overall energy of a chalcogenide memory material decreases as the fractional crystallinity increases. Formation (nucleation and growth) of a crystalline state or crystalline domains within a partially-crystalline or amorphous state is kinetically enabled above the crystallization temperature, so that heating above the crystallization temperature promotes crystallization by providing energy that facilitates the rearrangements of atoms needed to form a crystalline phase or domain. The fractional crystallinity of a partially-crystalline state can be controlled by controlling the temperature or time of heating or by controlling the temperature or rate of cooling. Through proper control of the peak temperature, time of heating and rate of cooling, structural states over a wide range of fractional crystallinity can be achieved for the chalcogenide phase-change materials.

The use of electrical energy to induce structural transformations relies on the application of electrical (current or voltage) pulses to a chalcogenide memory material. The mechanism of electrically-induced structural transformations is based on the Joule heating created by resistance of the material and/or neighboring resistive electrodes to current flow. Joule heating corresponds to a conversion of electrical energy to thermal energy and leads to an increase in the temperature of the chalcogenide material. By controlling the current density, the temperature can be increased to above the crystallization temperature, between the crystallization temperature and melting temperature, or above the melting temperature.

The crystalline phase portions of a chalcogenide memory material are sufficiently conductive to permit current densities that provide adequate Joule heating. The amorphous phase portions, however, are much less conductive and ordinarily would not support current densities sufficient to heat the material to the crystallization temperature or melting temperature. It turns out, however, that the amorphous phase of chalcogenide memory materials can be electrically switched to a highly conductive "dynamic" state upon application of a voltage greater than the threshold voltage as shown in FIG. 1. In the dynamic state, an amorphous phase region of a chalcogenide phase-change material can support a current density that is high enough to heat the material to or above the crystallization or melting temperature through Joule heating. As a result, nucleation and/or growth of a crystalline phase can be induced in an amorphous phase region. (For more information on electrical switching in chalcogenide materials see U.S. Pat. No. 6,967,344 entitled "Multi-Terminal Chalcogenide Switching Devices".) By controlling the magnitude and/or duration of electrical pulses applied to a chalcogenide phase-change material, it is possible to continuously vary the fractional crystallinity through controlled interconversion of the crystalline and amorphous phases.

Joule heating produced in layers adjacent to the phase-change material may facilitate structural transformations. In many device designs, for example, resistive heaters in electrical communication with a phase-change material are located in close proximity to the phase-change material. The passage of current through a resistive heater produces thermal energy in the environment of the phase-change material that may be used to drive or aid structural transformations during programming.

The effect of electrical stimulation on a chalcogenide memory material is generally depicted in terms of the R-I (resistance—current) relationship of the material. The R-I relationship shows the variation of the programmed electrical resistance of a chalcogenide memory material as a function of the amount of electrical energy provided or as a function of the magnitude of the current or voltage pulse applied to a chalcogenide memory material. The R-I response is a convenient representation of the effect of crystalline-amorphous structural transformations on electrical resistance. A brief discussion of the R-I characteristics of chalcogenide memory materials follows.

Figure 2:
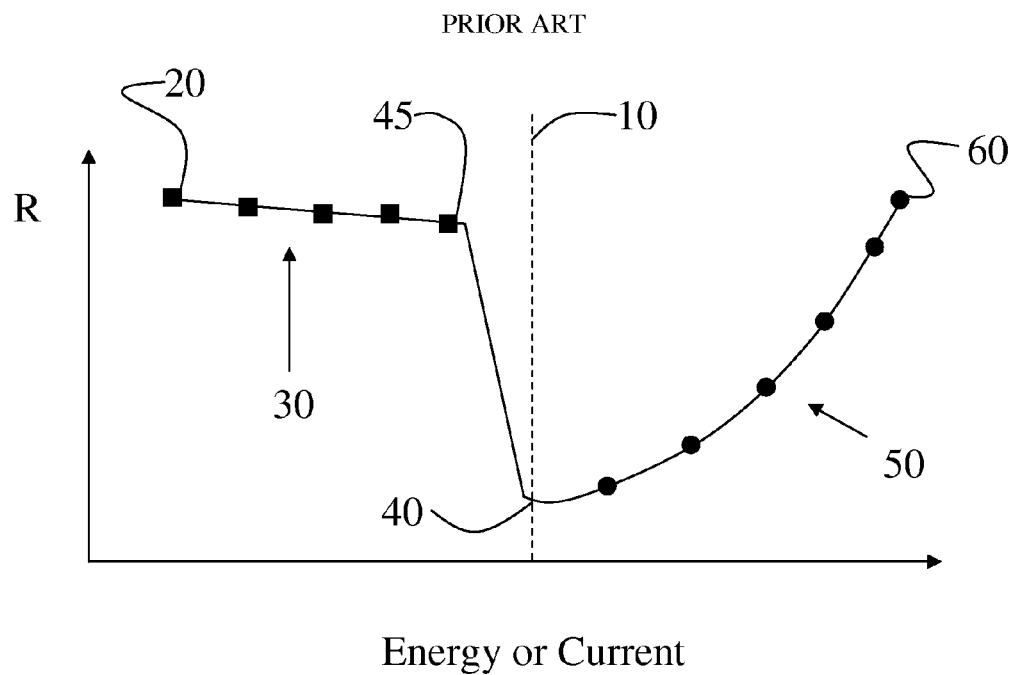
FIG. 2 is an illustrative Resistance vs. Energy/Current plot for a chalcogenide phase-change material.

A representative depiction of the electrical resistance (Resistance) of a chalcogenide memory material as a function of electrical energy or current pulse magnitude (Energy/Current) is presented in the resistance plot shown in FIG. 2. The resistance plot includes two characteristic response regimes of a chalcogenide memory material to electrical energy. The regimes are approximately demarcated with the vertical dashed line 10 shown in FIG. 2. The regime to the left of the line 10 may be referred to as the accumulating regime of the memory material. The accumulation regime is distinguished by a nearly constant or gradually varying electrical resistance with increasing electrical energy that culminates in an abrupt decrease in resistance at a critical energy (which may be referred to herein as the set energy). The accumulation regime thus extends, in the direction of increasing energy, from the leftmost point 20 of the resistance plot, through a plateau region (generally depicted by 30) corresponding to the range of points over which the resistance variation is small or gradual to the set point or state 40 that follows an abrupt decrease in electrical resistance. Plateau 30 may be horizontal or sloping.

The left side of the resistance plot is referred to as the accumulating regime because the structural state of the chalcogenide material cumulatively evolves as energy is applied. More specifically, the fractional crystallinity of the structural state increases with the total applied energy so that the material "accumulates" crystalline phase content in this regime. The leftmost point 20 corresponds to the structural state in the accumulating regime having the lowest fractional crystallinity and may be referred to as the reset state. This state may be fully amorphous or may be primarily amorphous with some degree of crystalline content. As energy is added, the chalcogenide material progresses among a plurality of partially-crystalline states with increasing fractional crystallinity along plateau 30 as crystalline phase regions accumulate in the material. Selected accumulation states (structural states in the accumulation region) are marked with squares in FIG. 2.

Upon accumulation of a sufficient amount of crystalline phase content, the fractional crystallinity of the chalcogenide memory material increases sufficiently to effect a setting transformation. The setting transformation is characterized by a dramatic decrease in electrical resistance and culminates in stabilization of set state 40. The structural states in the accumulation regime may be referred to as accumulation states of the chalcogenide memory material. Structural transformations in the accumulating regime are unidirectional in that they progress in the direction of increasing applied energy within plateau region 30 and are reversible only by first driving the chalcogenide material through the set point 40 and the reset point 60, resetting the device. Once the reset state is obtained, lower amplitude current pulses can be applied and the accumulation response of the chalcogenide material can be restored.

The addition of energy to a chalcogenide material in the accumulating regime is believed to lead to an increase in fractional crystallinity through the formation of new crystalline domains, growth of existing crystalline domains or a combination thereof. It is believed that the electrical resistance varies only gradually along plateau 30 despite the increase in fractional crystallinity because the crystalline domains form or grow in relative isolation of each other so as to prevent the formation of a contiguous crystalline network that spans the chalcogenide material between the two electrodes of the memory device. This type of crystallization may be referred to herein as sub-percolation crystallization.

In one model, the setting transformation coincides with a percolation event in which a contiguous, interconnected crystalline network forms within the chalcogenide material, where the network bridges the space between the two electrodes of the device. Such a network may form, for example, when crystalline domains increase sufficiently in size to impinge upon neighboring domains. Since the crystalline phase of chalcogenide materials is more conductive than the amorphous phase, the percolation event corresponds to the formation of a contiguous conductive pathway between the top and bottom electrodes through the chalcogenide material. As a result, the percolation event is marked by a dramatic decrease in the resistance of the chalcogenide material, where the resistance of the material following the percolation event depends to a large extent on the effective cross-sectional area of the percolation path. The leftmost point 20 of the accumulation regime may be an amorphous state or a partially-crystalline state lacking a contiguous crystalline network. Sub-percolation crystallization commences with an initial amorphous or partially-crystalline state and progresses through a plurality of partially-crystalline states having increasingly higher fractional crystallinities until the percolation threshold is reached and the setting transformation occurs.

The regime to the right of the line 10 of FIG. 2 may be referred to as the direct overwrite regime. The direct overwrite regime extends from set state 40 through a plurality of intermediate states (generally depicted by 50) to a reset point or state 60. The various points in the direct overwrite regime may be referred to as direct overwrite states of the chalcogenide memory material. Selected direct overwrite states are marked with circles in FIG. 2. Structural transformations in the direct overwrite regime may be induced by applying an electric current or voltage pulse to a chalcogenide material.

In the direct overwrite regime, the resistance of the chalcogenide memory material varies with the magnitude of the applied electric pulse. The resistance of a particular direct overwrite state is characteristic of the structural state of the chalcogenide memory material, and the structural state is dictated by the magnitude of the applied current pulse. The fractional crystallinity of the chalcogenide memory material decreases as the magnitude of the current pulse increases. The fractional crystallinity is highest for direct overwrite states at or near set point 40 and progressively decreases as reset state 60 is approached. The chalcogenide memory material transforms from a structural state possessing a contiguous crystalline network at set state 40 to a structural state that is amorphous, substantially amorphous or partially-crystalline without a contiguous crystalline network at reset state 60. The application of current pulses having increasing magnitude has the effect of converting portions of the crystalline network into an amorphous phase and ultimately leads to a disruption or interruption of contiguous high-conductivity crystalline pathways in the chalcogenide memory material. As a result, the resistance of the chalcogenide memory material increases with increasing applied current in the direct overwrite region.

In contrast to the accumulating region, structural transformations in the direct overwrite region are reversible and bi-directional. As indicated hereinabove, each state in the direct overwrite region may be identified by its resistance and an associated current pulse magnitude, where application of the associated current pulse magnitude induces changes in fractional crystallinity that produce the particular resistance state. Application of a subsequent current pulse may increase or decrease the fractional crystallinity of an existing resistance state of the chalcogenide memory material. If the subsequent current pulse has a higher magnitude than the pulse used to establish the existing state, the fractional crystallinity of the chalcogenide memory material decreases and the structural state is transformed from the existing state in the direction of the reset state along the direct overwrite resistance curve. Similarly, if the subsequent current pulse has a lower magnitude than the pulse used to establish the existing state, the fractional crystallinity of the chalcogenide memory material increases and the structural state is transformed from the existing state in the direction of the set state along the direct overwrite resistance curve.

The direct overwrite states of the chalcogenide memory material may be used to define memory states of a memory device. Most commonly, the memory devices are binary memory devices that utilize two of the direct overwrite states as memory states, where a distinct data value (e.g. "0" or "1") is associated with each state. Each binary memory state corresponds to a distinct structural state of the chalcogenide material. Readout or identification of the state can be accomplished by measuring the resistance of the material (or device) since each structural state is characterized by a distinct resistance value. The operation of transforming a chalcogenide memory material to the structural state associated with a particular memory state may be referred to herein as programming the chalcogenide memory material, writing to the chalcogenide memory material or storing information in the chalcogenide memory material. The resistance of the memory state established by programming the chalcogenide memory material may also be referred to herein as the programmed resistivity of the material or programmed resistance of the device.

To facilitate readout and minimize reading errors, it is desirable to select the memory states of a binary memory device so that the contrast in resistance of the two states is large. Typically the set state (or a state near the set state) and the reset state (or a state near the reset state) are selected as memory states in a binary memory application. The resistance contrast depends on details such as the chemical composition of the chalcogenide, the thickness of the chalcogenide material in the device and the geometry of the device. For a layer of phase-change material having the composition $Ge_{22}Sb_{22}Te_{56}$, a thickness of ~600 Å, and pore diameter of below ~0.1 μm in a typical two-terminal device geometry, for example, the resistance of the reset state is ~100-1000 kΩ and the resistance of the set state is under ~10 kΩ. Phase-change devices in general show resistances in the range of ~100 kΩ to ~1000 kΩ in the reset state and resistance of ~0.5 kΩ to ~50 kΩ in the set state. In the preferred phase-change devices, the resistance of the reset state is at least a factor of two, and more typically an order of magnitude or more, greater than the resistance of the set state.

Representative compositions of chalcogenide phase-change materials have been discussed in U.S. Pat. Nos. 5,543,737; 5,694,146; 5,757,446; 5,166,758; 5,296,716; 5,534,711; 5,536,947; 5,596,522; and 6,087,674; the disclosures of which are hereby incorporated by reference in their entirety herein. The chalcogenide phase-change materials generally include one or more elements from column VI of the periodic table (the chalcogen elements) and optionally one or more chemical modifiers from columns III, IV or V. One or more of S, Se, and Te are the most common chalcogen elements included in a chalcogenide phase-change material. Suitable modifiers include one or more of trivalent and tetravalent modifying elements such as As, Ge, Ga, Si, Sn, Pb, Al, Sb, In, and Bi. Transition metals such as Cu, Ni, Zn, Ag, and Cd may also be used as modifiers. A preferred chalcogenide composition includes one or more chalcogenide elements along with one or more trivalent or tetravalent modifiers and/or one or more transition metal modifiers. Materials that include Ge, Sb, and/or Te, such as $Ge_2Sb_2Te_5$, are examples of chalcogenide phase-change materials in accordance with the instant invention. Other examples of phase-change materials include, but are not limited to, GaSb, InSb, InSe, $Sb_2Te_3$, GeTe, $Ge_2Sb_2Te_5$, ternary Ge—Sb—Te compositions, InSbTe, ternary In—Sb—Te compositions, ternary GaSeTe compositions, TAG and other ternary Te—As—Ge compositions, GaSeTe, $SnSb_2Te_4$, InSbGe, ternary In—Sb—Ge compositions, AgInSbTe, quaternary Ag—In—Sb—Te compositions, (GeSn)SbTe, quaternary Ge—Sn—Sb—Te compositions, GeSb(SeTe), quaternary Ge—Sb—Se—Te compositions, and $Te_{81}Ge15Sb_2S_2$ and quaternary Te—Ge—Sb—S compositions. U.S. Pre-Grant Pub. 20070034850 and U.S. Pat. No. 7,525,117, the disclosures of which are hereby incorporated by reference in their entirety, disclose phase-change materials having reduced Ge and/or Te content.

This invention provides a device structure that facilitates reduction of the current required to program a variable resistance memory device. In a typical variable resistance device configuration, the active material is placed between two electrodes and programmed by applying a current between the electrodes. In the device structure of this invention, a breakdown layer is included between the active variable resistance material and an electrode of the device. The breakdown layer is in electrical series with the electrode and the active variable resistance material. To appreciate the benefits of the instant invention, it is helpful to review the principles underlying the effect of a breakdown layer on device performance.

As noted above, transformation of a variable resistance material between different programming states occurs through a Joule heating process. The amount of Joule heat Q produced by a given current flow is given by:

$$Q=I^2Rt$$

where I is the current, R is the resistance of the material through which the current flows, and t is the time interval over which current flows through the material. The Joule heat Q constitutes a local source of energy that increases the temperature of the variable resistance material. As indicated hereinabove, if the variable resistance material is a phase-change material, heat sufficient to increase the temperature to at least the crystallization temperature is required to induce crystallization and heat sufficient to increase the temperature to at least the melting temperature is required to induce amorphization. The temperature increase of the phase-change material resulting from the production of a given amount Q of Joule heat depends on the volume of phase-change material over which the heat operates. A greater temperature increase occurs if the heat is localized to a restricted volume of phase-change material than if the heat is broadly distributed over a large volume of phase-change material.

The spatial region over which a given amount Q of Joule heat operates depends on the rate of spatial dissipation of the heat from the point of generation to surrounding regions of the device (e.g. through thermal diffusion caused by temperature gradients) and the volume over which the current acts. For a given device structure, the thermal diffusion contribution is constant and the extent to which the heat is localized is controlled primarily by the cross-sectional area of current flow.

Inclusion of a breakdown layer promotes a reduction of programming current by restricting the cross-sectional area through which current enters or exits the variable resistance memory material. The restricted cross-sectional area leads to a concentration of Joule heat onto a reduced volume of phase-change material. Greater localization of the Joule heat leads to a greater increase in temperature of the phase-change material within the restricted volume for a given level of current. The net result of the localization of current provided by the breakdown layer is the generation of higher local temperatures (albeit over a smaller volume of phase-change material) from a given applied current. Stated alternatively, current localization means that targeted local temperatures (such as the crystallization or melting temperature of a phase-change material) can be achieved with lower currents.

The instant invention provides a breakdown layer that allows for more consistent placement of the punctured region formed during the breakdown event. In a typical prior art variable resistance memory device utilizing breakdown layers, the working region of the device includes a series configuration of a programming electrode, a breakdown layer, a variable resistance material, and a counterelectrode. (As used herein, "programming electrode" refers to the negative electrode that receives positive current from the variable resistance material and "counterelectrode" refers to the positive electrode that delivers current to the variable resistance material. Oftentimes, the programming electrode is the lower electrode and the counterelectrode is the upper electrode of the device.) The working region of a device is generally formed over an underlying substrate (e.g. silicon wafer) that may also include grid lines, access devices (e.g. diodes, transistors, Ovonic threshold switching devices), or circuitry. Typically, the lower and upper electrodes are connected to grid lines (e.g. word lines, bit lines) in an array of variable resistance devices, where the grid lines are connected to external driver circuitry that provides the electrical current or voltage pulses needed to read or write the variable resistance material and external detection circuitry (e.g. sense amplifiers, comparators) for determining the resistance of individual devices in the array. Configurations and circuitry for operating variable resistance memory devices (individually or in arrays) is known in the art. Although the discussion herein focuses on the working region, it is to be understood that, in practice, the devices are configured with reading and writing circuitry and may further include a substrate, isolation, and/or protective layers. It is further understood that the working region of a device is electrically isolated from other devices in an array and/or surrounding conductive pathways that provide a source of current. During operation, current delivered by the counterelectrode passes through the variable resistance material to the programming electrode.

Figure 3:
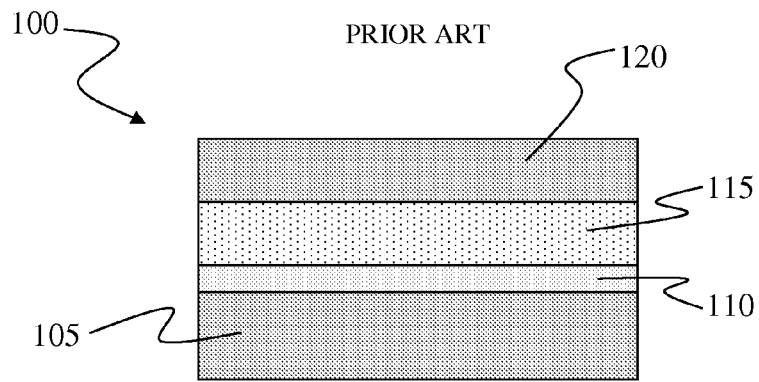
FIG. 3 depicts the working region of a variable resistance breakdown device having a breakdown layer with uniform thickness.

A depiction of the working region of a typical prior art breakdown device is shown in FIG. 3. Working region 100 includes lower electrode 105, breakdown layer 110, electrically-stimulable variable resistance material 115, and upper electrode 120. For purposes of this illustration, lower electrode 105 is the programming electrode and upper electrode 120 is the counterelectrode. Lower electrode 105 and upper electrode 120 are formed from a conductive or semi-resistive material. Representative electrode materials include metals (transition metals (e.g. Ti, W, Cu), post-transition metals (e.g. Al), metal alloys, metal nitrides (e.g. titanium nitride, titanium aluminum nitride, molybdenum nitride), carbon, and nitrogenated forms of carbon. The electrodes may also be composite materials that include multiple layers (e.g. Ti/TiN, carbon/MoN). Breakdown layer 110 is a dielectric material, such as an oxide (e.g. $SiO_2$) or nitride (e.g. $Si_3N_4$).

Figure 4:
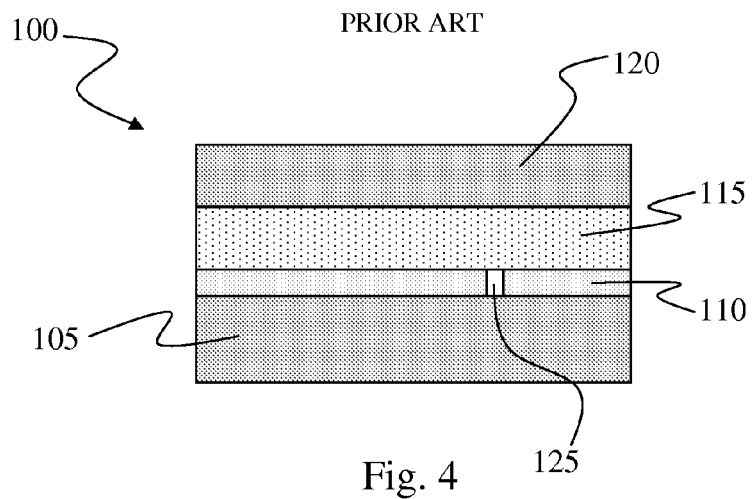
FIG. 4 depicts the device of FIG. 3 having a puncture in the breakdown layer.

Working region 100 is operated by applying a voltage between lower electrode 105 and upper electrode 120. Since breakdown layer 110 is a dielectric, it initially prevents current flow between lower electrode 105 and upper electrode 120 and no current passes through to variable resistance material 115. As the voltage applied between lower electrode 105 and upper electrode 120 is increased, the strength of the electric field across breakdown layer 110 increases. At some critical electric field strength, breakdown layer 110 undergoes a breakdown event and ruptures to form puncture 125 shown in FIG. 4. Following the breakdown event, breakdown layer 110 readily permits current flow from upper electrode 120 to variable resistance material 115 through puncture 125 to lower electrode 105. Puncture 125 constitutes a conductive conduit through which current is channeled, thereby permitting programming or reading of the variable resistance material 115.

Figure 5:
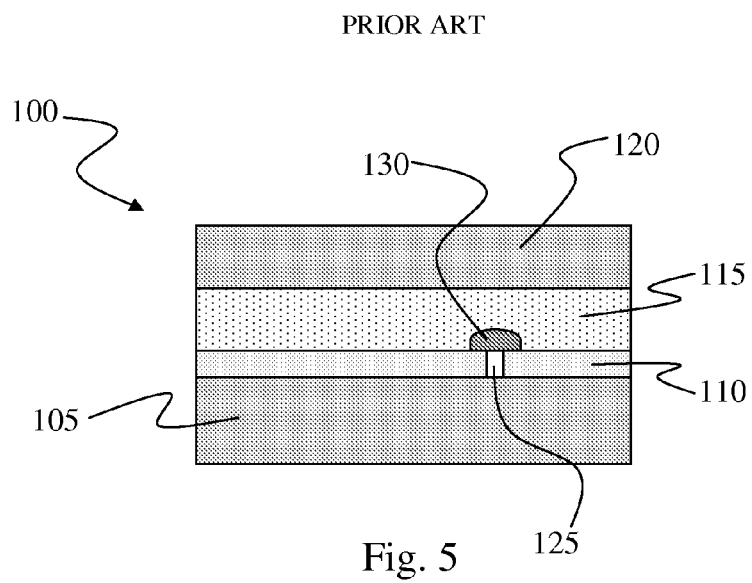
FIG. 5 depicts the effect of programming on the variable resistance material of the device of FIG. 4.

Because of the localized nature of puncture 125, the volume of variable resistance material 115 over which the current density is high enough to generate sufficient heat for programming is limited to the region adjacent to puncture 125. FIG. 5 depicts programmed volume 130 of variable resistance material 115 that forms when programming current flows from upper electrode 120 to lower electrode 105 through variable resistance material 115 via puncture 125. As noted above, minimization of the programmed volume reduces the energy required for programming and as a result, lower programming currents can be utilized. As a practical matter, the programmed volume need only be large enough to provide sufficient contrast in resistance to permit unambiguous detection of the different programmed states. In devices employing phase-change materials, adequate resistance contrast between programmed states can be achieved with programmed volumes having lateral dimensions as small as a few to several nanometers because of the large inherent difference in resistivity between the amorphous and crystalline phases.

One problem with prior art breakdown layers is an inability to control the breakdown event. The location of the puncture and voltage required to rupture the breakdown layer are unpredictable. In arrays, for example, uncertainty in the breakdown process leads to variability in the placement of the puncture region across the constituent devices. Uncertainty in breakdown voltage can lead to application of excessive voltages in an effort to insure rupturing of the breakdown layer. Excessive voltages, however, can lead to variability in the dimensions of punctured regions within a breakdown layer. Excessive voltages may also lead to the formation of multiple punctures within a breakdown layer. Uncertainty in the location, dimensions, and number of punctures in a breakdown layer leads to inconsistencies in the operating characteristics across the devices of an array.

The instant inventors hypothesize that the uniformity in the thickness of breakdown layers used in prior art devices is a contributing factor to the uncertainty in breakdown characteristics. To remedy the uncertainty, the instant inventors have designed a variable resistance device that utilizes a breakdown layer having a non-uniform thickness. The instant inventors note that the breakdown event occurs when the electric field strength across the breakdown layer exceeds a critical value and recognize that for a fixed voltage difference between the lower and upper electrodes of a particular device geometry, the electric field strength across the breakdown layer depends on the thickness of the breakdown layer.

Figure 6A:
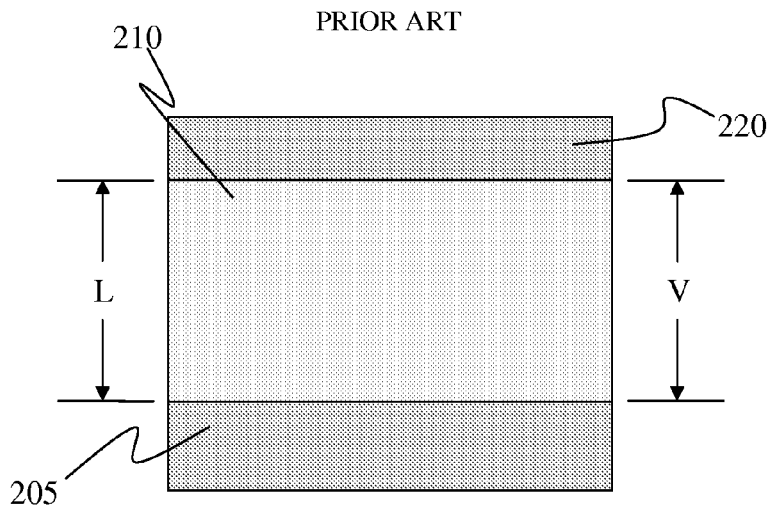
FIGS. 6A-6C depict variable resistance devices having breakdown layers of uniform thickness, where the relative thicknesses of the breakdown layer and variable resistance material vary.
Figure 6B:
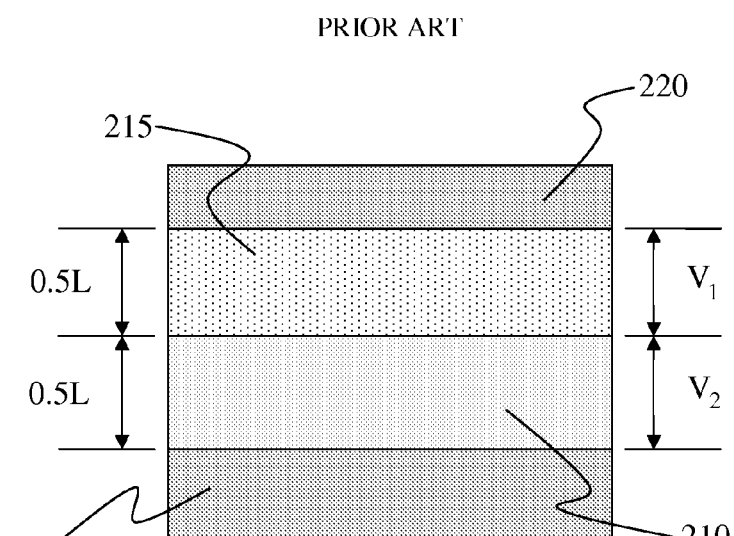
Figure 6C:
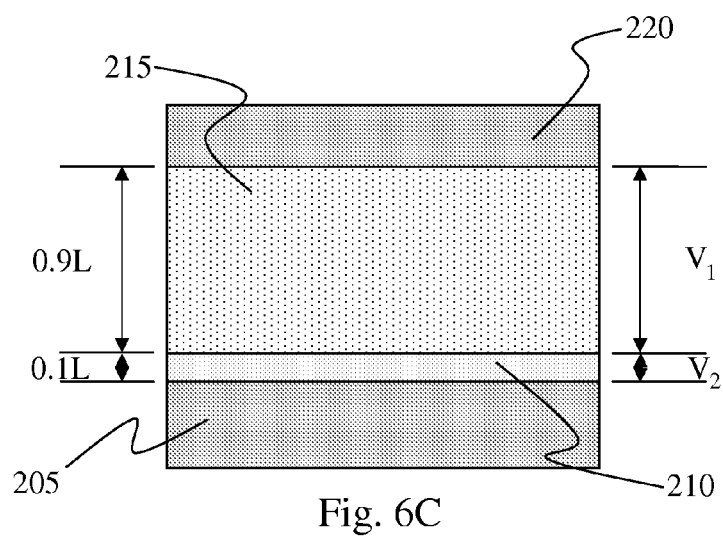

FIGS. 6A-6C show three variable resistance memory devices that include breakdown layers of different thickness. FIG. 6A corresponds to a limiting case in which the space between upper electrode 220 and lower electrode 205 is fully occupied by breakdown layer 210. For purposes of illustrating the dependence of electric field strength across the breakdown layer on the thickness of the breakdown layer, we assume a separation L between upper electrode 220 and lower electrode 205 and that a voltage V is applied between upper electrode 220 and lower electrode 205. In this situation, the electric field strength across breakdown layer 210 is V/L.

FIG. 6B shows a device in which the space between upper electrode 220 and lower electrode 205 is occupied equally by variable resistance material 215 and breakdown layer 210. The total separation and voltage between upper electrode 220 and lower electrode 205 remain L and V, respectively. The thicknesses of variable resistance material 215 and breakdown layer 210 are both L/2. FIG. 6C shows a device in which variable resistance material 215 and breakdown layer 210 occupy 90% and 10%, respectively, of the space between upper electrode 220 and lower electrode 205. In the device of FIG. 6C, as in the device of FIG. 6B, the total voltage between upper electrode 220 and lower electrode 205 is V and the total separation between upper electrode 220 and lower electrode 205 is L.

The total voltage V is divided into a voltage $V_1$ across variable resistance material 215 and a voltage $V_2$ across breakdown layer 210 in the devices shown in FIGS. 6B and 6C. To determine the electric field strength across breakdown layer 210 in each device, it is necessary to determine the voltage $V_2$. As is known in the art from principles of voltage division in series combinations of resistances in the art, the voltage $V_2$ is given by:

$$V_2 = \left(\frac{R_2}{R_1 + R_2}\right)V$$

where V is the total voltage between upper electrode 220 and lower electrode 205, $R_2$ is the resistance of breakdown layer 210, and $R_1$ is the resistance of variable resistance material 215.

In the simple device configurations shown in FIGS. 6B and 6C, the resistance of a material is given by:

$$R = \rho \frac{L}{A}$$

where $\rho$ is the resistivity of the material, L is the length of the material in the direction of current flow, and A is the cross-sectional area of the material. Substitution in the formula above for $V_2$ gives $$V_2 = \left(\frac{\rho_2 L_2}{\rho_1 L_1 + \rho_2 L_2}\right)V$$

where $\rho_1$ is the resistivity of variable resistance material 215, $\rho_2$ is the resistivity of breakdown layer 210, $L_1$ is the thickness of variable resistance material 215, and $L_2$ is the thickness of breakdown layer 210. The resistivity of a material depends on its chemical composition and structure. In the instant devices, breakdown layer 210 has a higher resistivity than variable resistance material 215. In a conservative scenario, the resistivity of breakdown layer 210 is much more than an order of magnitude greater than the resistivity of variable resistance material 215. For purposes of illustration, we let $\rho_1$, the resistivity of variable resistance material 215, be $\rho$ and $\rho_2$, the resistivity of breakdown layer 210, be $10\rho$. Substitution of these resistivities in the preceding formula provides:

$$V_2 = \left(\frac{10L_2}{L_1 + 10L_2}\right)V$$

and yields the relationship between the voltage $V_2$ and the thickness of breakdown layer 210 in a series combination of breakdown layer 210 with variable resistance material 215.

In the device of FIG. 6B, $L_1=L_2=0.5L$ and we obtain:

$$V_2 = \left(\frac{10}{11}\right)V$$

which means that $E_2$, the electric field strength across breakdown layer 210 is:

$$E_2 = \frac{V_2}{L_2} = \frac{\left(\frac{10}{11}\right)V}{0.5L} = \left(\frac{20}{11}\right)\frac{V}{L} = 1.82\frac{V}{L}$$

and we see that the electric field strength across breakdown layer 210 has increased by a factor of 1.82 in the device of FIG. 6B relative to the device of FIG. 6A as the thickness of breakdown layer 210 is reduced by a factor of two upon inclusion of variable resistance material 215 in the space between upper electrode 220 and lower electrode 205.

In the device of FIG. 6C, the thickness of breakdown layer 210 has been reduced by a factor of 10 relative to the device of FIG. 6A, so that $L_1=0.9L$ and $L_2=0.1L$. This leads to $$V_2 = \left(\frac{10}{19}\right)V$$

and $$E_2 = \frac{V_2}{L_2} = \frac{\left(\frac{10}{19}\right)V}{0.1L} = \left(\frac{100}{19}\right)\frac{V}{L} = 5.26\frac{V}{L}$$

and we see that a further reduction in the thickness of breakdown layer 210 leads to an even greater increase in the electric field strength across breakdown layer 210.

FIGS. 6A-6C illustrate the principle that for a given device configuration and given operating voltage, the electric field strength across a breakdown layer in series with a variable resistance material increases as the thickness of the breakdown layer decreases. Since a critical electric field strength is required to induce the breakdown event, the results indicate that rupture of the breakdown layer is more likely to occur in thinner breakdown layers than in thicker breakdown layers for a given device. The instant inventors recognize, however, that thinner breakdown layers remain susceptible to variability in the number, location, and size of puncture regions if the thickness of the breakdown layer is uniform. Accordingly, the instant invention provides a variable resistance memory device that incorporates a breakdown layer of variable thickness. In a variable-thickness breakdown layer, rupture is more likely to occur in the thinner portions than in the thicker portions in a given device configuration under a particular set of operating conditions. By controlling the thickness profile of the breakdown layer, it thus becomes possible to bias the breakdown process and to localize the breakdown event to a particular region within the breakdown layer. As a result, a more consistent and uniform breakdown process is expected and superior breakdown devices are obtained.

Figure 7A:
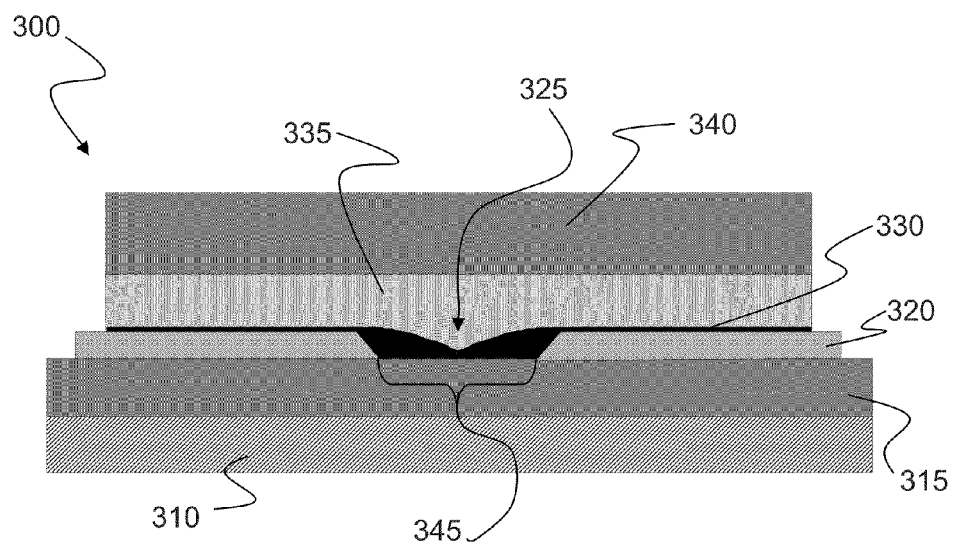
FIGS. 7A-7B depict illustrative variable resistance devices having breakdown layers with non-uniform thickness.
Figure 7B:
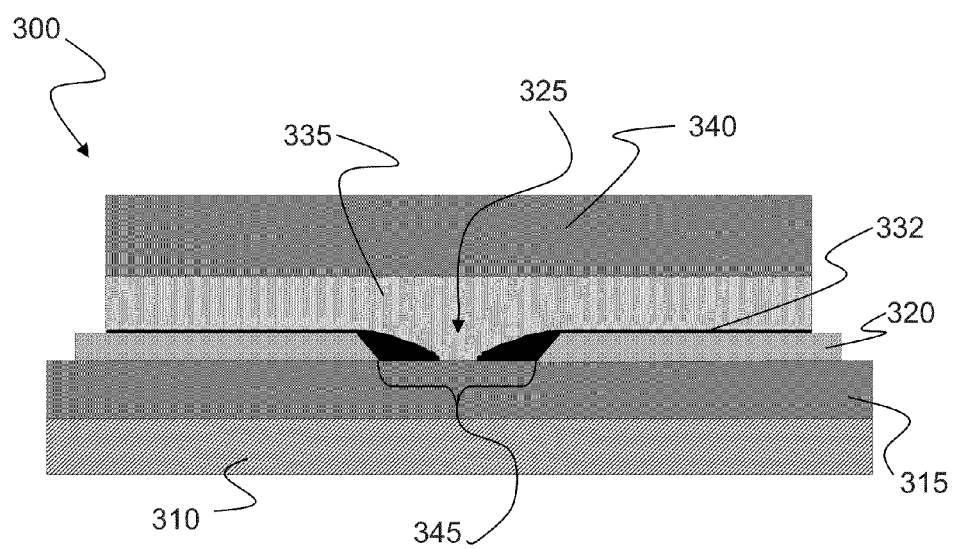

FIG. 7A depicts an illustrative example of a variable resistance device in accordance with the instant invention. Device 300 includes substrate 310, lower electrode 315, insulator 320 with opening 325, breakdown layer 330, variable resistance material 335, and upper electrode 340. Breakdown layer 30 has variable thickness across the region 345 of lower electrode 315 exposed by opening 325. (The region 345 of lower electrode 315 exposed by opening 325 may also be referred to herein as the exposed region 345 of lower electrode 315.) Breakdown layer 330 is thinnest at or near the center of opening 325 and becomes thicker with increasing distance away from the center of opening 325. Based on the thickness profile of breakdown layer 330, rupture is most likely to occur at or near the center of opening 325. FIG. 7B depicts an alternative embodiment in which breakdown layer 332 does not extend fully across exposed region 345 of lower electrode 315. In this embodiment, breakdown layer 332 includes an opening in its as-formed state and rupture is not necessary to achieve localization of the current used to program or read variable resistance material 335.

In the embodiments of FIGS. 7A and 7B, the variable resistance material is a single layer material. In other embodiments, the variable resistance material may be a multilayer material. The multilayer material may include two or more layers that differ in composition. In one embodiment, the multilayer material includes two phase-change layers, where the phase-change layers differ in composition. In the embodiments of FIGS. 7A and 7B, the device includes an insulator layer with an opening formed therein. The variable resistance material occupies the opening. In the embodiments of FIGS. 7A and 7B, the occupying variable resistance material fills the opening. In alternative embodiments, the occupying variable resistance material partially fills the opening.

Figure 8A:
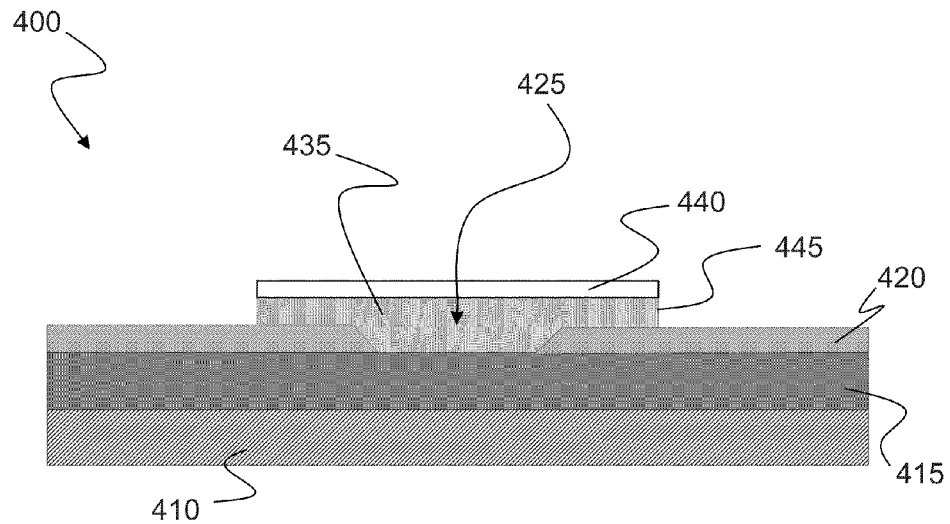
FIGS. 8A-8D depict a segmented variable resistance device at an intermediate stage of fabrication and the development of a breakdown layer having non-uniform thickness via a diffusion process.

In one embodiment, a variable thickness breakdown layer may be formed through a diffusion process. In a representative process, a substrate is provided and a lower electrode layer is formed thereon. After formation of the lower electrode layer, a layer of insulator is deposited and an opening is formed therein using, for example, a masking and etching or other patterning process known in the art. The opening in the insulator layer exposes the top surface of the lower electrode layer. A variable resistance material, such as a phase-change material, is next deposited over the opening and top surface of the insulator layer. The variable resistance material is next patterned and etched to form segmented or isolated regions of variable resistance material. FIG. 8A depicts the state of the device 400 at this stage of processing. Device 400 includes substrate 410, lower electrode 415, insulator 420 with opening 425, and segmented variable resistance material 435. The top surface of variable resistance material 435 is protected by mask 440. This mask may be a barrier layer for a subsequent gas treatment.

A breakdown layer having variable thickness can next be formed through a diffusion process by exposing the device shown in FIG. 8A to a gas. The gas may include neutral molecules, may be ionized or may be transformed to a plasma. Layer 440 is chosen to be a barrier layer, such as SiN, that does not readily allow for gas diffusion within it. Thus the gas preferentially diffuses through the variable resistance layer 445 and possibly through the insulator 420 laterally inward from the perimeter of segmented variable resistance material 435 and penetrates to the interior of the device. The diffusion process is governed by Fick's Law and driven by concentration gradients. The concentration of the diffusing species is highest at sidewall region 445 of variable resistance material 435. Diffusion occurs from the sidewall region toward the center of the device and the concentration of the diffusing species progressively decreases toward the interior of the device. As a result, a non-uniform concentration profile of the diffusing species develops, where the concentration of the diffusing species is lower toward the center of opening 425 and progressively increases toward the outer regions of opening 425. Ionized gases and plasmas may provide for expedited diffusion of a resistivity-enhancing species into or within variable resistance material 435.

The diffusing species is a species capable of interacting or reacting with variable resistance material 435 and/or lower electrode 415 to form a resistive breakdown layer. The diffusing species includes a resistivity-enhancing element or material. In one embodiment, the diffusing species includes oxygen and converts variable resistance material 435 and/or lower electrode 415 to a resistive oxide along the interface region. A diffusing oxygen species may be provided by delivering an oxygen-containing gas at the process step as depicted in FIG. 8A. In one embodiment, the oxygen-containing gas is $O_2$. In another embodiment, the diffusing species includes nitrogen and converts variable resistance material 435 and/or lower electrode 415 to a resistive nitride along the interface region. A diffusing nitrogen species may be provided by delivering a nitrogen-containing gas at the process step as depicted in FIG. 8A. In one embodiment, the nitrogen containing gas is $N_2$. In another embodiment, the nitrogen-containing gas is $NH_3$.

Figure 8B:
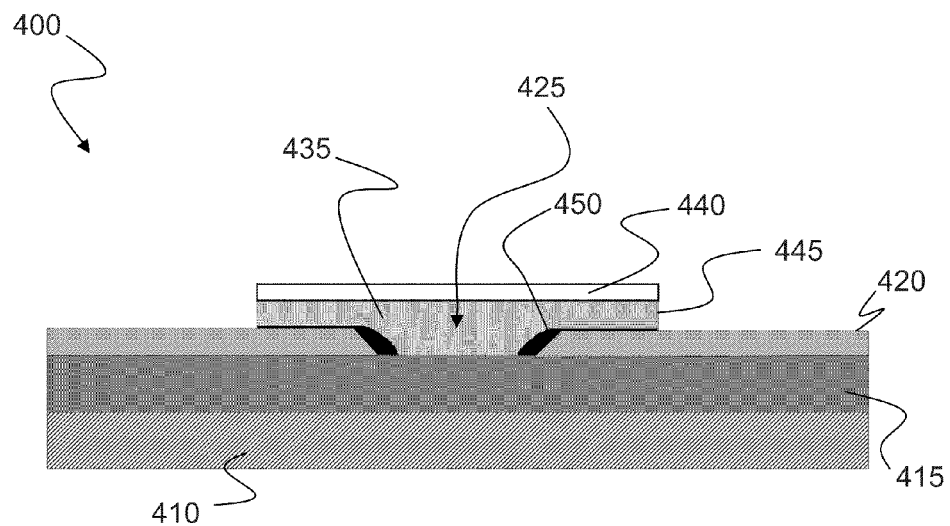
Figure 8C:
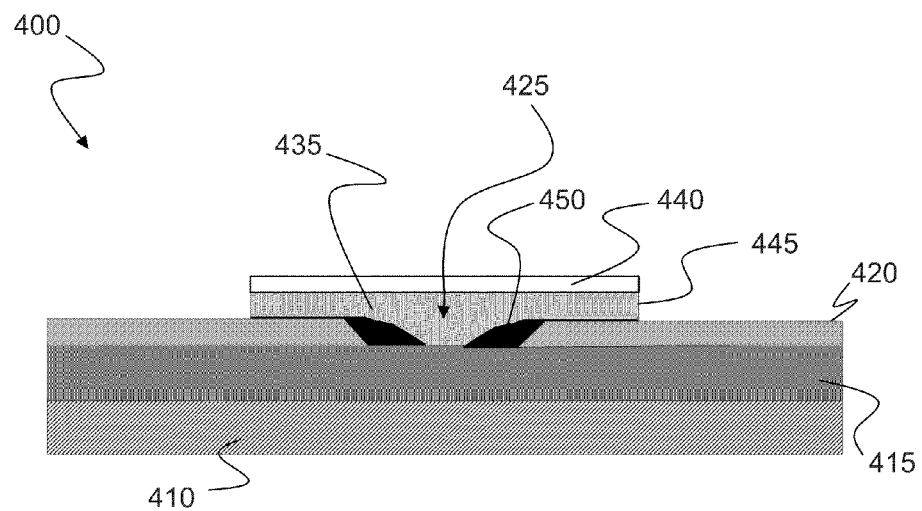
Figure 8D:
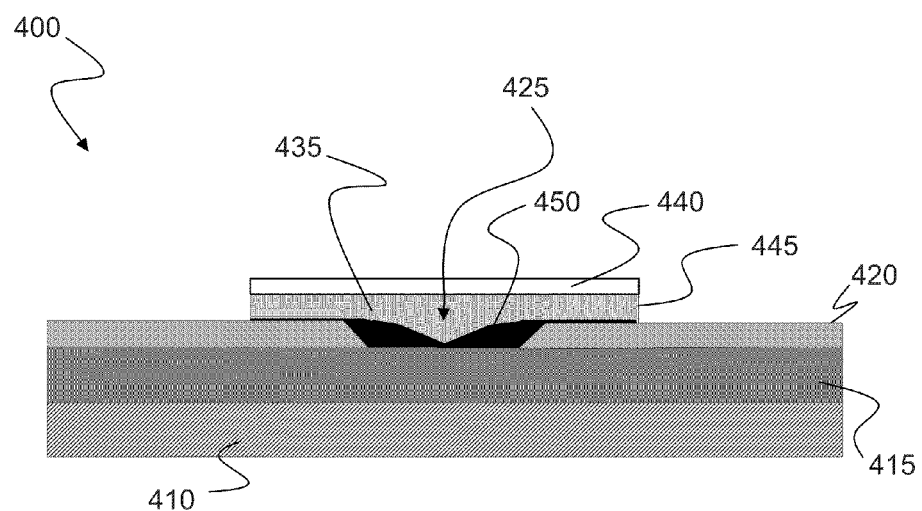

The thickness profile of the breakdown layer formed from a diffusing species can be controlled with process conditions. Process conditions such as the pressure of the gas containing the diffusing species, temperature, and time of exposure of the device to the gas containing the diffusing species can be varied to control the penetration of the diffusing species into the device. As a general rule, higher gas pressures and longer exposure times lead to greater penetration. FIGS. 8B-8D show illustrative thickness profiles of breakdown layers in accordance with the instant invention. In FIGS. 8B-8D, breakdown layer 450 directly contacts the region of lower electrode 415 exposed by opening 425. In addition, breakdown layer 450 is thinner toward the center of opening 425 and thicker toward the outer edges of opening 425. In one embodiment, breakdown layer 450 completely covers the portion of the top surface of lower electrode 415 exposed by opening 425. In another embodiment (such as shown in FIGS. 7A and 8D), the exposed region of lower electrode 415 directly contacts only breakdown layer 450. In other embodiments, breakdown layer 450 may not penetrate sufficiently to completely cover or overlap the exposed portion of lower electrode 415 and may instead simply reduce the area of contact between variable resistance material 435 and lower electrode 415. Breakdown layer 450 shown in FIGS. 8B-8D includes a curved surface. The curved surface is continuous without a corner or other discontinuity and has a curvature established at least in part as a consequence of Fick's law.

Although diffusion preferentially occurs laterally through variable resistance material 435, some diffusion may also occur through insulator 420. Since electrical programming is expected to occur toward the center of opening 425 adjacent to lower electrode 415, any effect of the diffusing gas on variable resistance material 435 in the vicinity of sidewall(s) 445 is expected to be too remote to materially influence the electrical characteristics of device 400. Interaction of the diffusing gas with the top surface of variable resistance material 435 may lead to formation of an insulating region at a position in electrical series with the yet-to-be-deposited upper electrode and may affect electrical characteristics. In some applications, the existence of a high resistance or insulating region at the top surface of variable resistance material 435 may be beneficial or non-detrimental. A device, for example, having a breakdown layer in close proximity with both the upper and lower electrode is within the scope of the instant invention.

After formation of breakdown layer 450, device fabrication may be completed by removing mask 440 and depositing a conductive upper electrode. As is known in the art, device processing may also include formation of barrier layers, carbon layers, protective layers, and/or encapsulating layers. Conductive grid lines may also be formed to connect the lower and upper electrodes to external circuitry. The principles of the instant invention further extend to the fabrication of device arrays. Array fabrication, for example, may include formation of a plurality of segmented variable resistance material device structures such as the one shown in FIG. 8A. The space between the different segmented structures may be filled with a dielectric to isolate the individual devices.

Figure 8E:
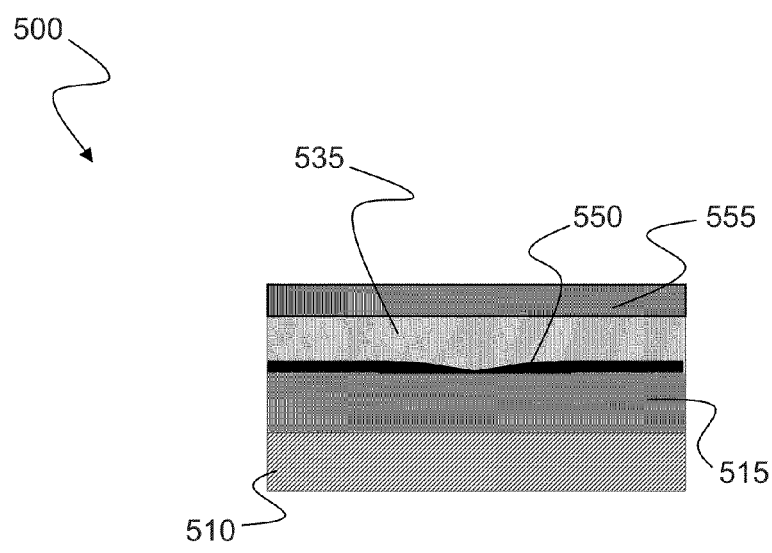
FIG. 8E depicts a thin film variable resistance device having a breakdown layer with non-uniform thickness.

The instant invention further extends to thin film device structures in which the variable resistance material is formed as a continuous layer in a device that lacks an opening in which the variable resistance material is deposited. A thin film device may, for example, include a substrate with a lower electrode layer formed thereon. A variable resistance material may then be formed directly on the lower electrode layer without an intervening dielectric layer. In this configuration, the variable resistance material may be segmented and a breakdown layer may be formed via a diffusion process as described hereinabove. Fabrication of the device may continue, for example, by depositing a dielectric material to isolate the individual devices and an upper conductive material to provide a second electrode. FIG. 8E shows thin film device 500 that includes substrate 510, lower electrode 515, breakdown layer 550 having non-uniform thickness, variable resistance material 535, and upper electrode 555.

Those skilled in the art will appreciate that the methods and designs described above have additional applications and that the relevant applications are not limited to those specifically recited above. Also, the present invention may be embodied in other specific forms without departing from the essential characteristics as described herein. The embodiments described above are to be considered in all respects as illustrative only and not restrictive in any manner.

We claim:

1. An electronic device comprising:
   a first electrode;
   a variable resistance material formed over said first electrode; and
   a breakdown layer between said variable resistance material and said first electrode, said breakdown layer having a non-uniform thickness.

2. The device of claim 1, wherein said first electrode comprises a metal, a metal carbide, a metal silicide or a metal nitride.

3. The device of claim 2, wherein said first electrode further comprises aluminum or silicon.

4. The device of claim 1, wherein said variable resistance material is a phase-change material.

5. The device of claim 4, wherein said phase-change material is a chalcogenide material.

6. The device of claim 5, wherein said chalcogenide material comprises Te or Se.

7. The device of claim 6, wherein said chalcogenide material further comprises Ge, Sb, In, or Sn.

8. The device of claim 1, wherein said variable resistance material directly contacts said first electrode.

9. The device of claim 1, wherein said breakdown layer directly contacts said variable resistance material.

10. The device of claim 9, wherein said breakdown layer directly contacts said first electrode.

11. The device of claim 1, wherein said breakdown layer comprises a curved surface.

12. The device of claim 11, wherein the curvature of said curved surface is at least in part a consequence of Fick's law.

13. The device of claim 1, wherein said first electrode has a center region and an outer region and said breakdown layer is thinner over said center region than said outer region.

14. The device of claim 1, wherein said breakdown layer comprises an oxide or nitride.

15. The device of claim 1, wherein said variable resistance material is a multilayer material, said multilayer material including a first layer having a first composition and a second layer having a second composition.

16. The device of claim 1, further comprising a dielectric material formed over said first electrode, said dielectric material having an opening formed therein, said opening exposing a region of said first electrode; said variable resistance material occupying said opening.

17. The device of claim 16, wherein said opening has a round cross-section.

18. The device of claim 16, wherein said opening includes a trench.

19. The device of claim 16, wherein said variable resistance material fills said opening.

20. The device of claim 16, wherein said breakdown layer directly contacts said exposed region of said first electrode.

21. The device of claim 20, wherein the entirety of said exposed region of said first electrode directly contacts said breakdown layer.

22. The device of claim 20, wherein said breakdown layer directly contacts said variable resistance material.

23. The device of claim 1, further comprising a second electrode, said second electrode being formed over said variable resistance material.

24. A method of operating the device of claim 23 comprising:
providing a first voltage between said first electrode and said second electrode, said first voltage being sufficient to rupture said breakdown layer, said rupturing forming a puncture in said breakdown layer.

25. The method of claim 24, further comprising:
providing a second voltage between said first electrode and said second electrode, said second voltage causing current to flow through said puncture.

26. The method of claim 25, wherein said current programs said variable resistance material.

27. A method of making an electronic device comprising:
forming a first conductive material;
forming a variable resistance material over said first conductive material; and
forming a breakdown layer between said first conductive material and said variable resistance material, said breakdown layer being formed after said formation of said first conductive material and after said formation of said variable resistance material.

28. The method of claim 27, wherein said variable resistance material is a phase-change material.

29. The method of claim 28, wherein said phase-change material is a chalcogenide material.

30. The method of claim 29, wherein said chalcogenide material comprises Te or Se.

31. The method of claim 30, wherein said chalcogenide material further comprises Ge, Sb, In, or Sn.

32. The method of claim 27, wherein said variable resistance material directly contacts said first conductive material.

33. The method of claim 27, wherein said breakdown layer directly contacts said variable resistance material.

34. The method of claim 33, wherein said breakdown layer directly contacts said first conductive material.

35. The method of claim 27, wherein said breakdown layer has a non-uniform thickness.

36. The method of claim 35, wherein said first conductive material has a center region and an outer region and said breakdown layer is thinner over said center region than over said outer region.

37. The method of claim 27, wherein said formation of said breakdown layer occurs through a diffusion process.

38. The method of claim 37, wherein said diffusion process comprises exposing said variable resistance material and said first conductive material to a gas.

39. The method of claim 38, wherein said gas comprises a resistivity-enhancing species, said resistivity-enhancing species diffusing within said variable resistance material.

40. The method of claim 39, wherein said variable resistance material forms an interface with said first conductive material and said resistivity-enhancing species diffuses along said interface.

41. The method of claim 39, wherein said resistivity-enhancing species reacts with said variable resistance material or said first conductive material to form a resistive material.

42. The method of claim 41, wherein said resistive material is an oxide or a nitride.

43. The method of claim 41, wherein said breakdown layer comprises said resistive material.

44. The method of claim 38, wherein said gas comprises oxygen or nitrogen.

45. The method of claim 27, further comprising forming a second conductive material over said variable resistance material.

46. The method of claim 27, further comprising forming a dielectric material over said first conducive material and forming an opening in said dielectric material, said forming dielectric material and said forming opening occurring before said forming breakdown layer.

47. The method of claim 46, wherein said opening has a round cross-section.

48. The method of claim 46, wherein said opening includes a trench.

49. The method of claim 46, wherein said forming variable resistance material comprises filling at least a portion of said opening with said variable resistance material.

50. The method of claim 49, wherein said variable resistance material fills said opening.

51. The method of claim 49, wherein said opening exposes a portion of said first conductive material.

52. The method of claim 51, wherein said breakdown layer directly contacts said exposed region of said first conductive material.

53. The method of claim 52, wherein the entirety of said exposed region of said first conductive material directly contacts said breakdown layer.

54. The method of claim 52, wherein said breakdown layer directly contacts said variable resistance material.

* * * * *